(12) United States Patent
Tatemichi et al.

(10) Patent No.: US 11,982,701 B2
(45) Date of Patent: May 14, 2024

(54) TEST METHOD

(71) Applicant: FUJI ELECTRIC CO., LTD., Kanagawa (JP)

(72) Inventors: Shuhei Tatemichi, Matsumoto (JP); Kenichi Ishii, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/890,233

(22) Filed: Aug. 17, 2022

(65) Prior Publication Data
US 2023/0113109 A1    Apr. 13, 2023

(51) Int. Cl.
*G01R 31/26* (2020.01)
*G01R 31/28* (2006.01)
*H01L 21/66* (2006.01)

(52) U.S. Cl.
CPC ....... *G01R 31/261* (2013.01); *G01R 31/2879* (2013.01); *H01L 22/14* (2013.01)

(58) Field of Classification Search
CPC .............. G01R 31/261; G01R 31/2879; G01R 31/2619; H01L 22/14
USPC .................................... 324/762.01, 537, 500
See application file for complete search history.

(56) References Cited

U.S. PATENT DOCUMENTS

| | | | | |
|---|---|---|---|---|
| 11,022,654 | B1* | 6/2021 | Wang | G01R 31/2879 |
| 2008/0067381 | A1* | 3/2008 | Hiroi | H01J 37/28 |
| | | | | 250/310 |
| 2019/0064251 | A1* | 2/2019 | Yoshida | G01R 31/2621 |
| 2022/0059419 | A1* | 2/2022 | Kurosawa | G01R 31/2853 |
| 2022/0254917 | A1* | 8/2022 | Kagoyama | G01R 31/2601 |
| 2022/0308108 | A1* | 9/2022 | Yamada | G01R 31/311 |

FOREIGN PATENT DOCUMENTS

JP    2007327918 A    12/2007

* cited by examiner

*Primary Examiner* — Giovanni Astacio-Oquendo

(57) ABSTRACT

Provided is a test method comprising: preparing a plurality of groups for setting, each of which has a plurality of semiconductor devices for setting, and assigning an inspection voltage to each of the respective plurality of groups for setting; performing first testing by applying the assigned inspection voltage to the semiconductor devices for setting, and testing, at a first temperature, the plurality of semiconductor devices for setting included in each of the plurality of groups for setting; performing second testing by testing, at a second temperature different from the first temperature, a semiconductor device for setting having been determined as being non-defective and by detecting a breakdown voltage at which the semiconductor device for setting is broken; acquiring a relationship between the inspection voltage and the breakdown voltage; and setting an applied voltage used when testing a semiconductor device under test at the first temperature, based on the acquired relationship.

20 Claims, 13 Drawing Sheets

TEST METHOD

The contents of the following Japanese patent application(s) are incorporated herein by reference:
No. 2021-164725 filed in JP on Oct. 6, 2021.

BACKGROUND

1. Technical Field

The present invention relates to a test method of a semiconductor device.

2. Related Art

In the related art, known is a method of screening a semiconductor device such as a transistor (for example, refer to Patent Document 1).
Patent Document 1: Japanese Patent Application Publication No. 2007-327918

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

Figure 1:
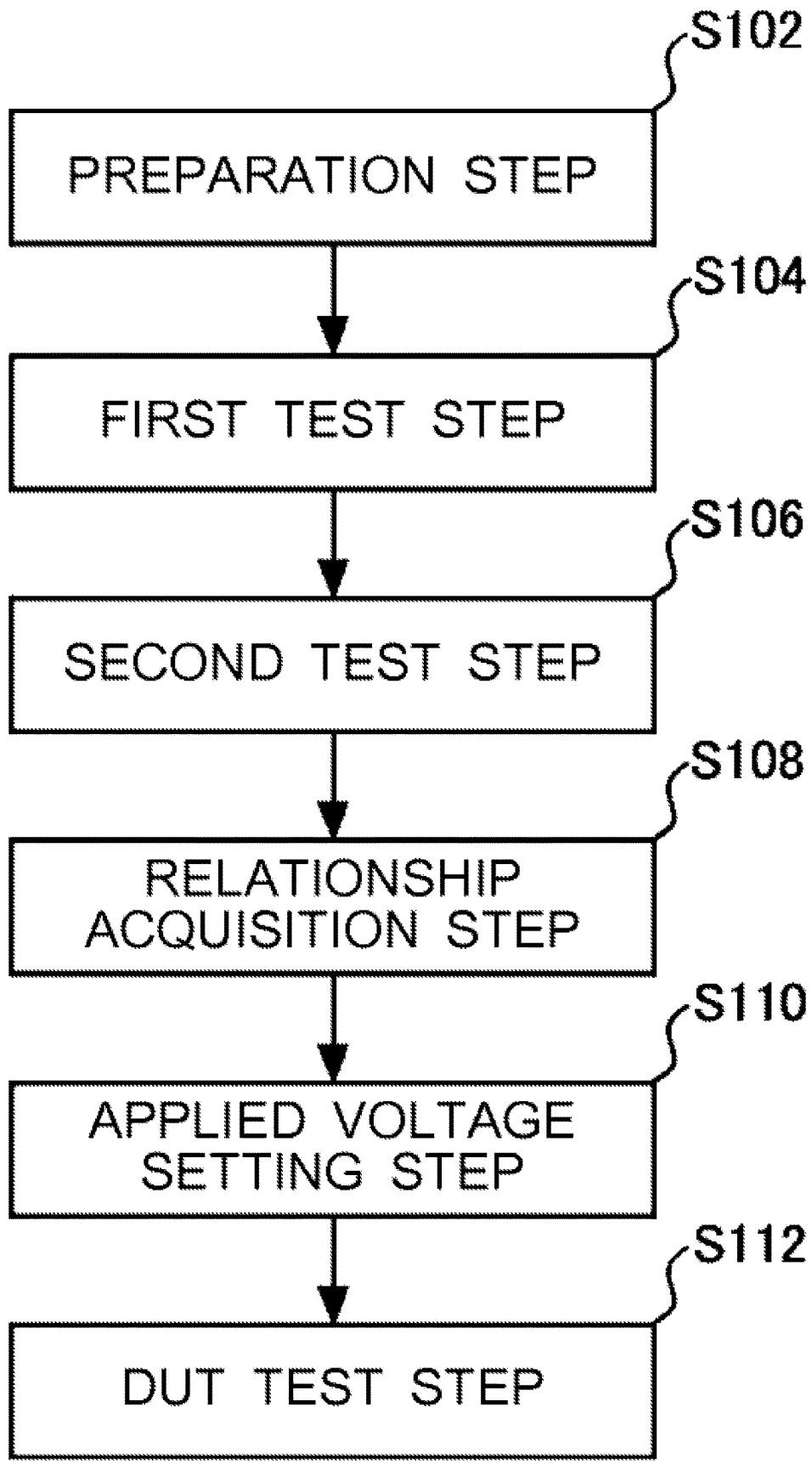
FIG. 1 is a flowchart showing an outline of a test method of a semiconductor device according to one embodiment of the present invention.

FIG. 1 is a flowchart showing an outline of a test method of a semiconductor device according to one embodiment of the present invention. For example, the semiconductor device is an IGBT (Insulated Gate Bipolar Transistor), but is not limited thereto. In the test method of the present example, a semiconductor device having no predetermined withstand voltage is screened. As a specification of the semiconductor device, a withstand voltage at a predetermined temperature such as −40° C. may be set. In this case, it is conceived to perform the test in a state where the semiconductor device is cooled to −40° C., but the test efficiency is deteriorated.

In the test method of the present example, a relationship between a withstand voltage of the semiconductor device at a first temperature (for example, room temperature such as 25° C.) and a withstand voltage of the semiconductor device at a second temperature (for example, −40° C.) is estimated in advance. From the relationship, the withstand voltage at the first temperature, which corresponds to a required value of the withstand voltage that the semiconductor device should have at the second temperature, is estimated. By testing the semiconductor device at the first temperature by using a condition corresponding to the estimated withstand voltage, the screening at the second temperature is carried out in a pseudo manner at the first temperature. Thereby, the test efficiency can be improved.

As shown in FIG. 1, the test method of the present example includes a preparation step S102, a first test step S104, a second test step S106, a relationship acquisition step S108, an applied voltage setting step S110, and a DUT test step S112. From the preparation step S102 to the applied voltage setting step S110, the withstand voltage at the first temperature, which corresponds to a required value of the withstand voltage that the semiconductor device should have at the second temperature, is estimated by using a semiconductor device for setting. In the DUT test step S112, a semiconductor device under test (DUT), which is to be tested, is tested under a condition corresponding to the estimated withstand voltage. The semiconductor device for setting and the semiconductor device under test are individuals different from each other. The semiconductor device for setting and the semiconductor device under test are preferably devices in which a part or all of structures of the devices is manufactured with the same design. Note that, the processing of S102 to S110 may not be carried out each time S112 is performed. The condition acquired in the processing of S102 to S110 can be continuously used in the processing of S112 for a certain period.

Figure 2:
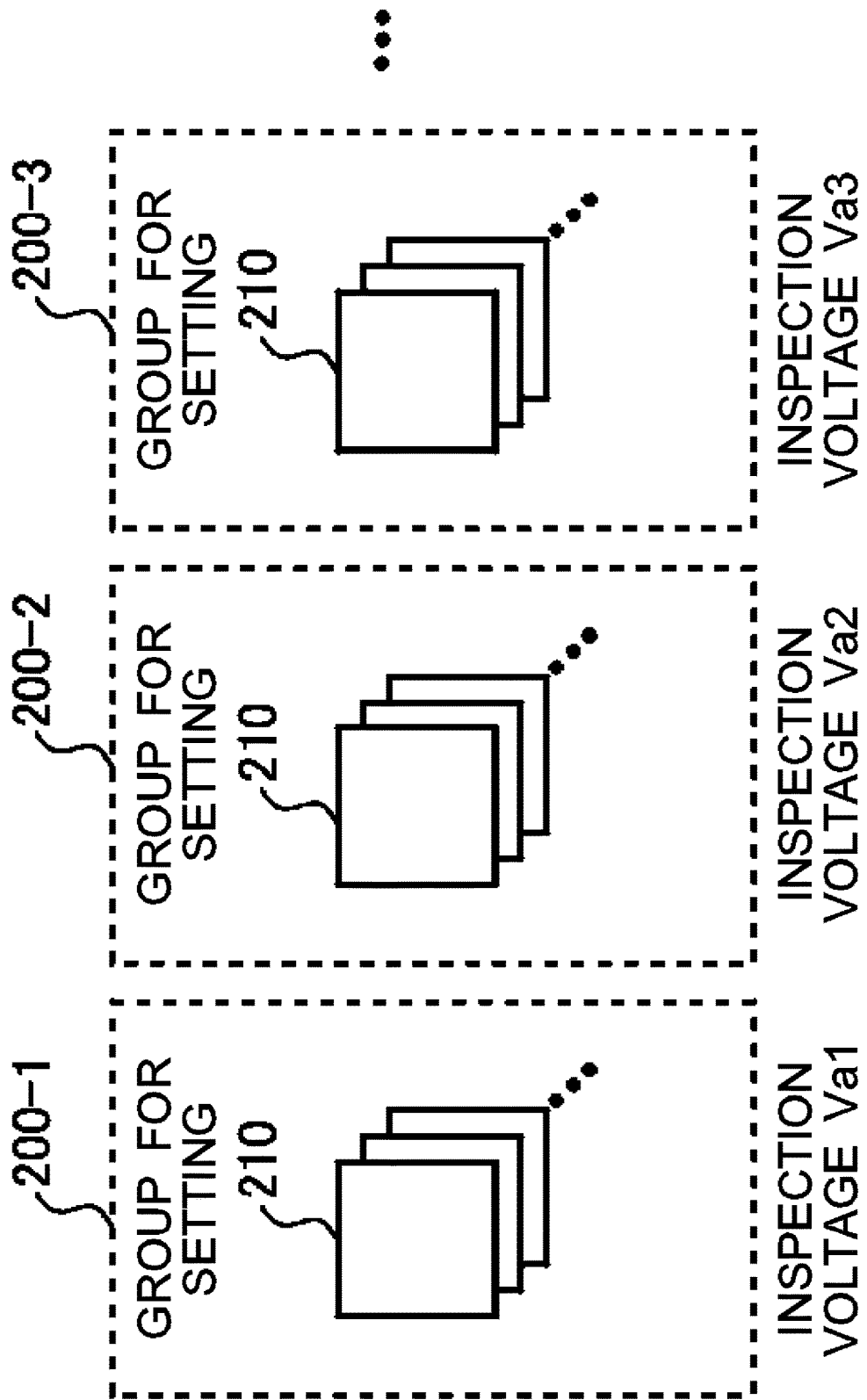
FIG. 2 shows an example of a preparation step S102.

FIG. 2 shows an example of the preparation step S102. In the preparation step S102, a plurality of groups for setting 200, each of which includes a plurality of semiconductor devices for setting 210, are prepared. In addition, different inspection voltages Va are assigned to each of the groups for setting 200. In the example of FIG. 2, inspection voltages Va1, Va2, Va3, are assigned to the groups for setting 200-1, 200-2, 200-3, . . . .

Figure 3:
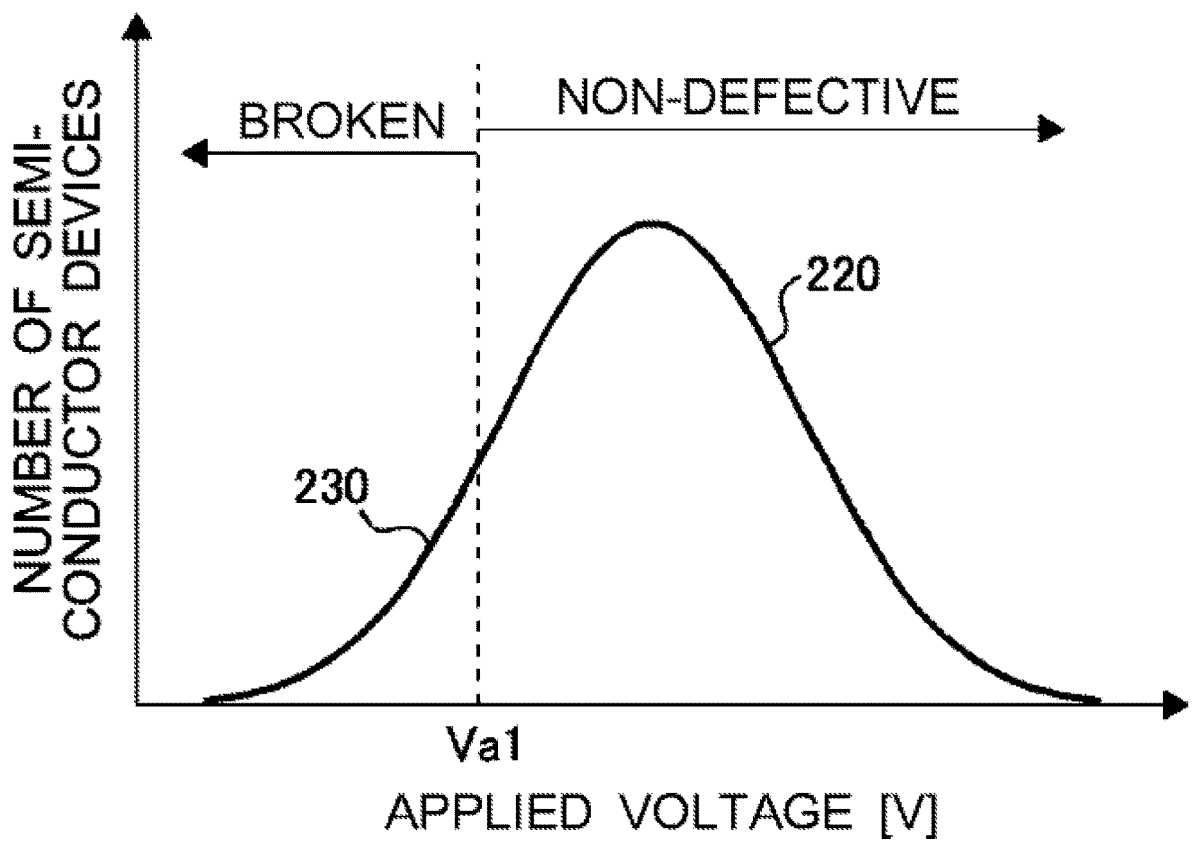
FIG. 3 shows a distribution example of withstand voltages of semiconductor devices for setting 210 of a group for setting 200-1.

FIG. 3 shows a distribution example of withstand voltages of the semiconductor devices for setting 210 of the group for setting 200-1. In FIG. 3, the horizontal axis shows the applied voltage to the semiconductor device for setting 210, and the vertical axis shows the number of semiconductor devices for setting 210 in which each applied voltage becomes a withstand voltage. As used herein, the applied voltage refers to a voltage that is applied between main terminals of the semiconductor device. In addition, applying a voltage to a semiconductor device means applying a voltage between the main terminals of the semiconductor device. The main terminal is a terminal through which a main current flows when the semiconductor device is in an ON state. When the semiconductor device is an IGBT, the main terminals are a collector terminal and an emitter terminal. In addition, the breakdown of the semiconductor device refers to an irreversible change of a characteristic of the semiconductor device before and after the breakdown. For example, when a voltage equal to or higher than a breakdown voltage is applied to an insulating film or a semiconductor region of a semiconductor device, a structure of the insulating film or semiconductor irreversibly changes, so that a characteristic such as an insulation property changes.

In the first test step S104, the assigned inspection voltage Va is applied to the plurality of semiconductor devices for setting 210 included in each group for setting 200, and the test is performed at the first temperature T1. In the first test step S104, the inspection voltage Va may be applied to the semiconductor device for setting 210 in a state where the gate terminal and the emitter terminal of the semiconductor device for setting 210 are short-circuited each other. In the first test step S104, the semiconductor device for setting 210 broken as a result of applying the inspection voltage Va and the semiconductor device for setting 210 having been determined as being non-defective without being broken are divided.

FIG. 3 shows an example of a test result in the group for setting 200-1. The inspection voltage Va1 is applied to the semiconductor device for setting 210 of the group for setting 200-1 at the temperature T1. Similarly, the inspection voltage Van is applied to the semiconductor device for setting 210 of the group for setting 200-n at the temperature T1. The temperature T1 is, for example, 25° C., but is not limited thereto.

As shown in FIG. 3, among the semiconductor devices for setting 210 of the group for setting 200-1, a semiconductor device having a withstand voltage lower than the inspection voltage Va1 is broken, and a semiconductor device having a withstand voltage equal to or higher than the inspection voltage Va1 is not broken and is determined as being non-defective. In the first test step S104, the semiconductor devices for setting 210 are divided into a broken defective group 230 and a non-broken non-defective group 220.

Figure 4:
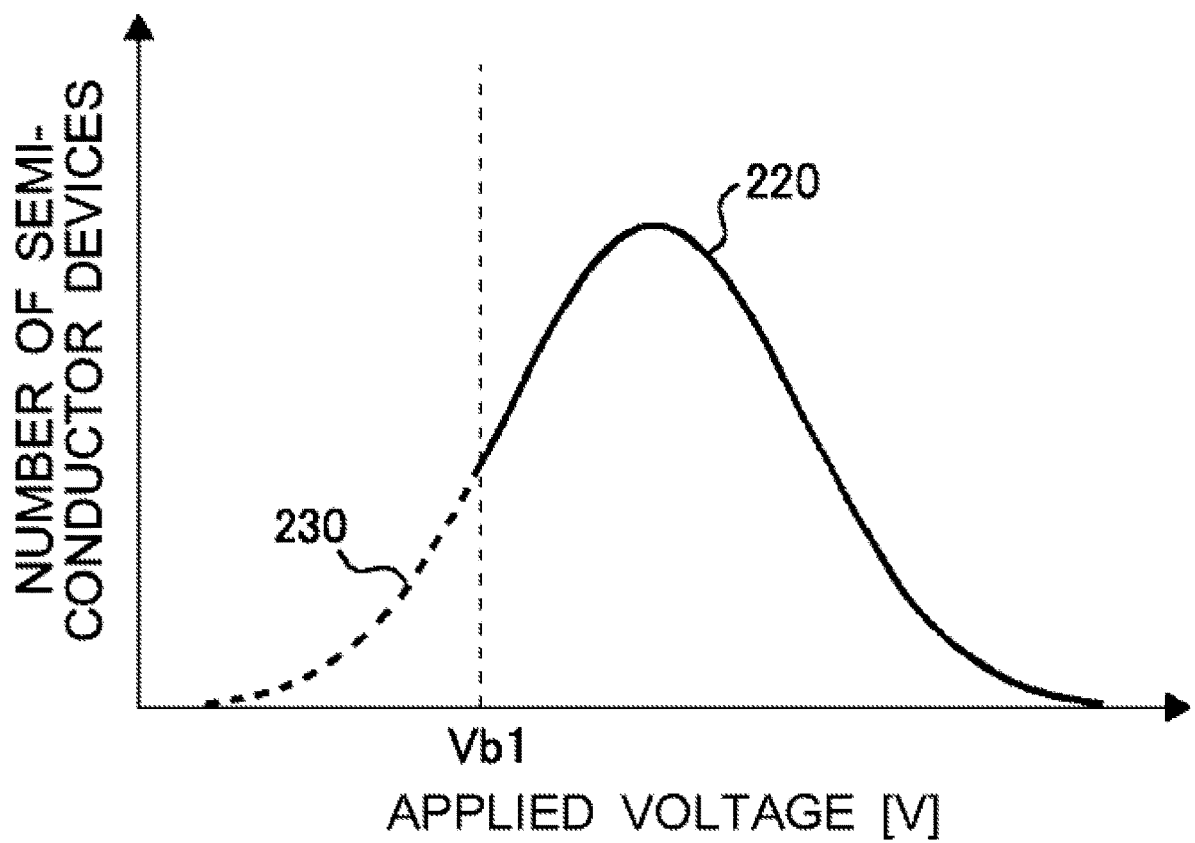
FIG. 4 shows a second test step S106.

FIG. 4 shows the second test step S106. In the second test step S106, the semiconductor device for setting 210 of the non-defective group 220 having been determined as being non-defective in the first test step S104 is tested at the second temperature T2 different from the first temperature T1. The second temperature T2 may be a temperature that is used to specify a specification value or a required value of a withstand voltage of a semiconductor device. The second temperature T2 may be lower than the first temperature T1. The second temperature T2 is, for example, −40° C., but is not limited thereto. A withstand voltage of a semiconductor device may decrease as the temperature decreases. For this reason, even if a predetermined withstand voltage is satisfied at the first temperature T1, the withstand voltage may not be satisfied at the second temperature T2. In the test method of the present example, a correlation between the withstand voltage at the second temperature T2 and the withstand voltage at the first temperature T1 is acquired in advance by the first test step S104 and the second test step S106. Then, by converting the required value or the like of the withstand voltage at the second temperature T2 into the withstand voltage at the first temperature T1, the withstand voltage test at the second temperature T2 can be performed in a pseudo manner at the first temperature T1.

In the second test step S106, a breakdown voltage Vb at which the semiconductor device for setting 210 of the non-defective group 220 is broken is detected for each group for setting 200. In the example of FIG. 4, the breakdown voltage Vb1 is detected for the group for setting 200-1. Similarly, the breakdown voltage Vbn is detected for the group for setting 200-n. In the second test step S106, the applied voltage to the semiconductor device for setting 210 may be gradually increased to detect the breakdown voltage at which each semiconductor device for setting 210 is broken. In the second test step S106, it is preferable to detect a minimum breakdown voltage Vb1 among the breakdown voltages Vb1 of the semiconductor devices for setting 210 of the non-defective group 220.

The semiconductor device for setting 210 showing the minimum breakdown voltage Vb1 is considered as being a semiconductor device for setting 210 having the lowest withstand voltage in the non-defective group 220. A magnitude relation of the withstand voltages of the plurality of semiconductor devices for setting 210 does not vary even when the test temperature changes. That is, when the withstand voltage of the first semiconductor device for setting 210-1 is higher than the withstand voltage of the second semiconductor device for setting 210-2 at the first temperature T1, the withstand voltage of the first semiconductor device for setting 210-1 is higher than the withstand voltage of the second semiconductor device for setting 210-2 even at the second temperature T2. Therefore, it is considered that the semiconductor device for setting 210 broken at the minimum breakdown voltage Vb1 at the second temperature T2 has a withstand voltage substantially the same as or slightly higher than the inspection voltage Va1 at the first temperature T1. For this reason, by acquiring the inspection voltage Va1 at the first temperature T1 and the breakdown voltage Vb1 at the second temperature T2, the relationship between the withstand voltage at the first temperature T1 and the withstand voltage at the second temperature T2 can be estimated.

Note that, the breakdown voltage Vb1 that is acquired in the second test step S106 is not limited to the minimum breakdown voltage Vb1. In the second test step S106, it is sufficient to acquire the breakdown voltage Vb1 by which it is possible to estimate the relationship between the withstand voltage at the first temperature T1 and the withstand voltage at the second temperature T2. In the second test step S106, the second lowest breakdown voltage Vb1 may be acquired, the $m^{th}$ lowest breakdown voltage Vb1 may be acquired, an average value of the breakdown voltages Vb1 of the non-defective group 220 may be acquired, or a value by another processing may also be acquired. When acquiring the minimum breakdown voltage Vb1, the minimum breakdown voltage Vb1 may be detected after measuring the breakdown voltages Vb1 of all the semiconductor devices for setting 210 of the non-defective group 220, or the minimum breakdown voltage Vb1 may also be acquired by another method.

Figure 5:
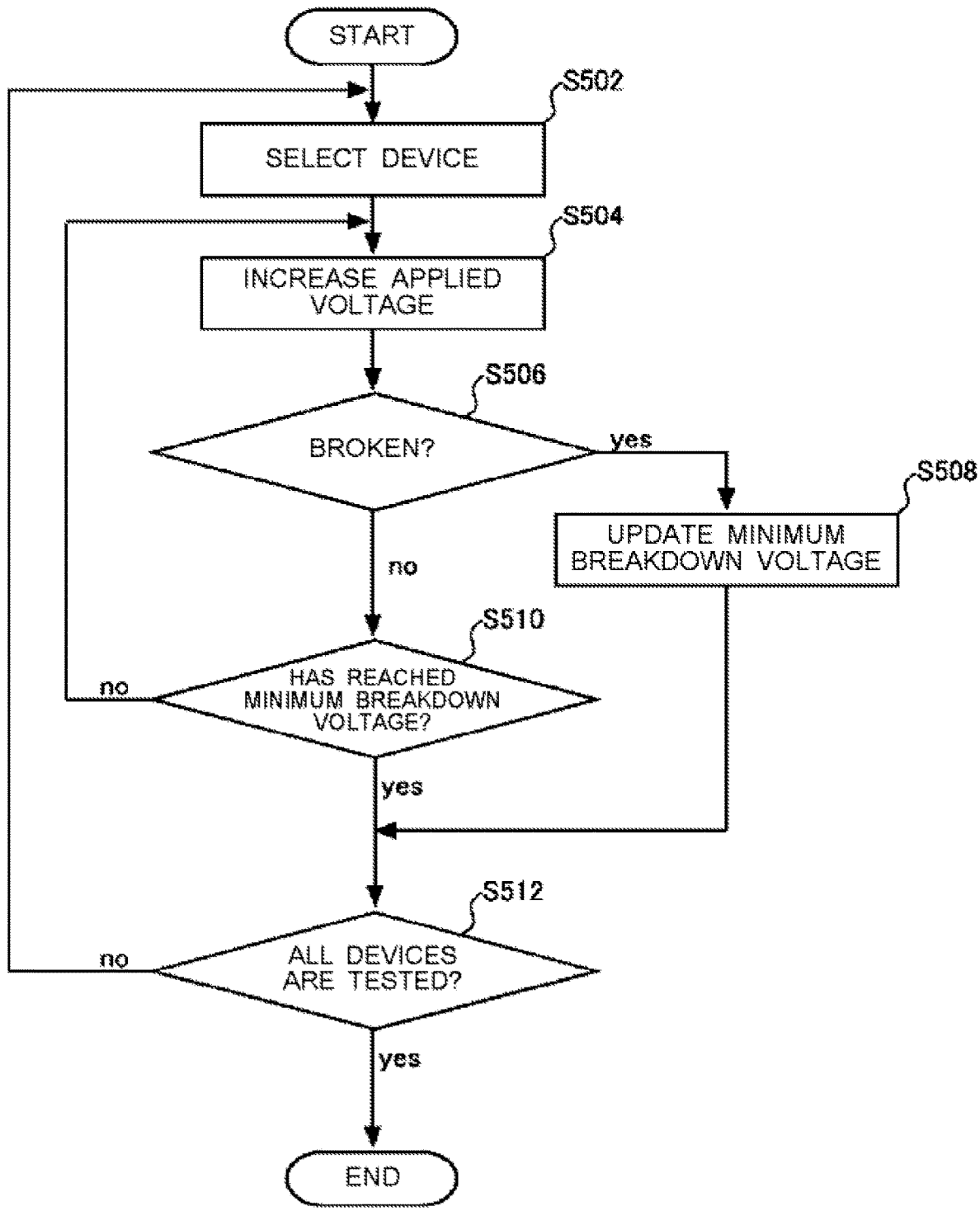
FIG. 5 shows an example of a method of acquiring a minimum breakdown voltage Vb1 in the second test step S106.

FIG. 5 shows an example of a method of acquiring the minimum breakdown voltage Vb1 in the second test step S106. In the second test step S106 of the present example, one or more semiconductor devices for setting 210 included in the non-defective group 220 are sequentially tested. In addition, in the test of each semiconductor device for setting 210, the applied voltage to the semiconductor device for setting 210 is gradually increased to detect the breakdown voltage of the semiconductor device for setting 210. Further, when the applied voltage to each semiconductor device for setting 210 has reached the minimum breakdown voltage Vb1 of the semiconductor device for setting 210 already tested, even if the semiconductor device for setting 210 is not broken, a next semiconductor device for setting 210 is tested.

Specifically, first, in S502, any semiconductor device for setting 210 included in the non-defective group 220 is selected. Next, in S504, the applied voltage to the semiconductor device for setting 210 is increased. In S504, the applied voltage may be increased by a predetermined unit increase. Further, in S504, an initial value of the applied voltage may be set. In S504, the applied voltage may be gradually increased from the initial value.

Next, in S506, it is determined whether the semiconductor device for setting 210 has been broken. When the semiconductor device for setting 210 has been broken, the applied voltage at that time is stored as the minimum breakdown voltage Vb1 (S508). In addition, when the semiconductor device for setting 210 has not been broken, it is determined whether the applied voltage has reached the stored minimum breakdown voltage Vb1 (S510). When the applied voltage has not reached the stored minimum breakdown voltage Vb1, the processing from S504 is repeated. Note that, when the first semiconductor device for setting 210 in the non-defective group 220 is being tested, since the minimum breakdown voltage Vb1 has not been stored yet, the processing of S504 and S506 is repeated until the semiconductor device for setting 210 is broken. When the applied voltage has reached the stored minimum breakdown voltage Vb1, it is determined that the semiconductor device for setting 210 has no possibility of updating the minimum breakdown voltage Vb1, and the test for the semiconductor device for setting 210 is ended.

Then, it is determined whether all the semiconductor devices for setting 210 have been tested (S512), and when a semiconductor device for setting 210 that has not been tested yet remains, a next semiconductor device for setting 210 is selected in S502, and the processing from S502 is repeated. When the test for all the semiconductor devices for setting 210 is completed, the second test step S106 is ended.

The processing shown in FIG. 5 is performed for the non-defective group 220 of each group for setting 200. Thereby, the minimum breakdown voltage Vb1 in each group for setting 200 can be detected without detecting the breakdown voltages of all the semiconductor devices for setting 210.

Figure 6:
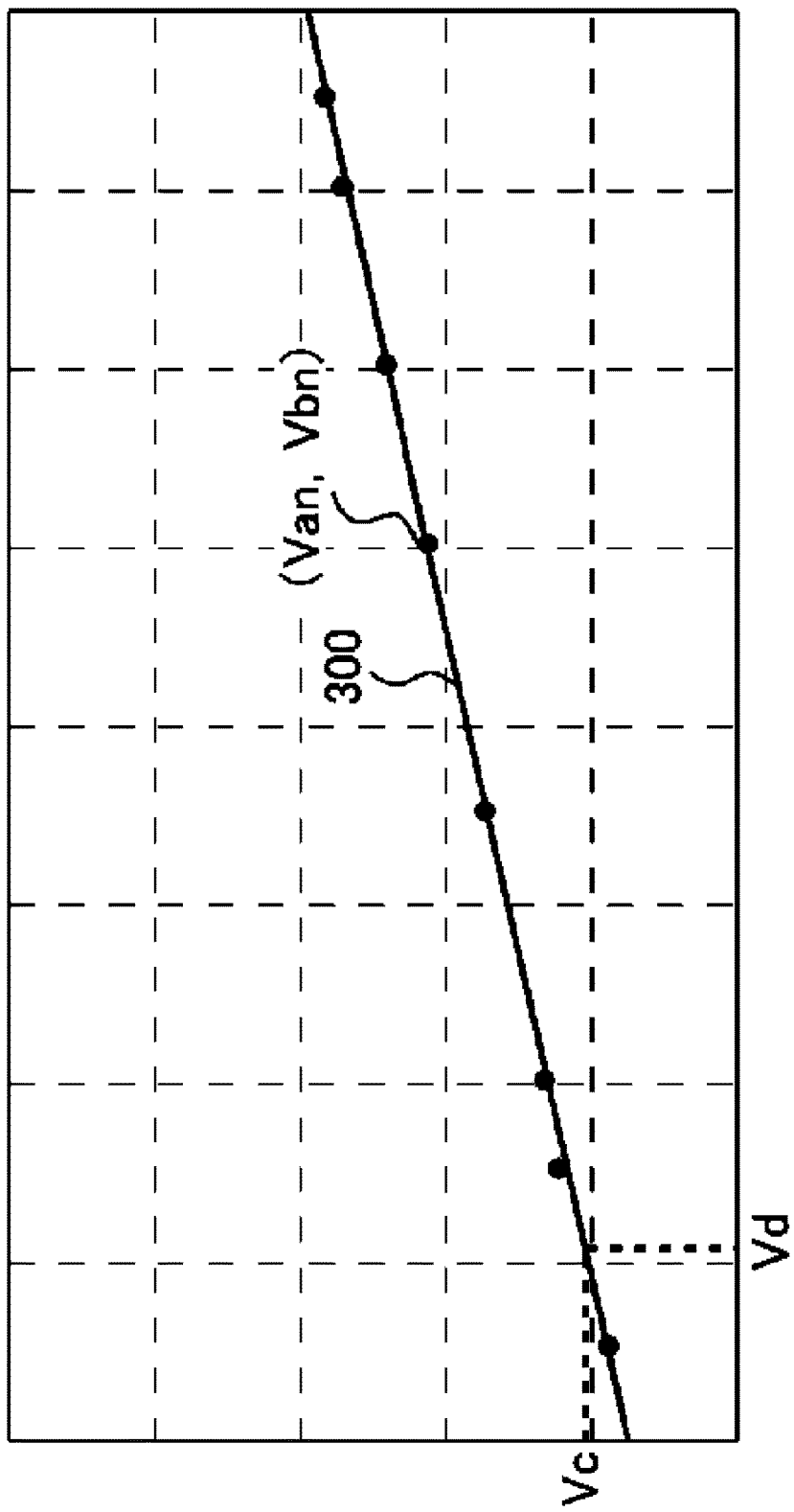
FIG. 6 shows an outline of a relationship acquisition step S108 and an applied voltage setting step S110.

FIG. 6 shows an outline of the relationship acquisition step S108 and the applied voltage setting step S110. In the relationship acquisition step S108, a relationship between the inspection voltage Van and the breakdown voltage Vbn in each group for setting 200-$n$ is acquired. In the relationship acquisition step S108 of the present example, measurement points (Van, Van) of the respective groups for setting 200-$n$ are plotted on a graph with the inspection voltage Va as the horizontal axis and the breakdown voltage Vb as the vertical axis. In FIG. 6, each measurement point is indicated by a circle. In the relationship acquisition step S108, an approximate line 300 that approximates the respective measurement points may be acquired. The approximate line 300 may be calculated using a computer by a method such as a least-square method.

The approximate line 300 shows a relationship between the inspection voltage Va at the first temperature T1 and the breakdown voltage Vb at the second temperature T2. By the approximate line 300, it is possible to estimate which inspection voltage Va at the first temperature T1 the breakdown voltage Vb at the second temperature T2 corresponds to.

In the applied voltage setting step S110, an applied voltage used when testing the semiconductor device under test at the first temperature T1 is set based on the relationship (for example, the approximate line 300) acquired in the relationship acquisition step S108. For example, in the applied voltage setting step S110, the applied voltage is set based on the withstand voltage that the semiconductor device under test should have at the second temperature T2 and the approximate line 300. For example, as shown in FIG. 6, when testing whether the semiconductor device under test has a withstand voltage of Vc at the second temperature T2, an inspection voltage Vd corresponding to a breakdown voltage Vc is extracted in the approximate line 300, and is set as the applied voltage at the first temperature T1.

By testing the semiconductor device under test by using the applied voltage Vd at the first temperature T1 in the DUT test step S112, a semiconductor device under test having no withstand voltage Vc at the second temperature T2 can be screened. In the DUT test step S112, the applied voltage Vd may be applied to the semiconductor device under test at the first temperature T1 to exclude a semiconductor device under test that has been broken.

Note that, in the second test step S106, an applied voltage at which the semiconductor device for setting 210 is broken may be used as the breakdown voltage, or a voltage applied immediately before the breakdown may be used as the breakdown voltage. The voltage applied immediately before the breakdown refers to an applied voltage in a step immediately before a step in which the semiconductor device for setting 210 is actually broken, when an applied voltage is gradually increased in each step, as shown in S504 of FIG. 5. The semiconductor device for setting 210 that is tested in the second test step S106 is a device that has not been broken by the inspection voltage Va in the first test step S104. Therefore, also in the second test step S106, by using, as the breakdown voltage Vb, the maximum voltage at which the semiconductor device for setting 210 is not broken, the relationship between the inspection voltage Va and the breakdown voltage Vb can be set accurately. Further, in the second test step S106, by using, as the breakdown voltage Vb, a voltage lower than a voltage at which the semiconductor device for setting 210 has been actually broken, the screening is made to have a margin and a semiconductor device under test having a low withstand voltage can be suppressed from being shipped.

Further, in the second test step S106, as shown by the solid line in FIG. 4, a distribution of the breakdown voltages of the semiconductor devices for setting 210 in each group for setting 200 may be detected. As shown in FIG. 4, the distribution can be approximated by, for example, a part of the Gaussian distribution. In the second test step S106, a minimum value of the breakdown voltage Vb at the second temperature T2 may be determined based on the acquired distribution. For example, in the second test step S106, when an actual number of breakdowns of the semiconductor devices for setting 210 at the extracted minimum breakdown voltage Vb1 deviates from the distribution approximated by the Gaussian distribution, the breakdown voltage may not be adopted as the minimum value. In the second test step S106, the next lowest breakdown voltage Vb1 may be adopted as the minimum value. This makes it possible to set the minimum breakdown voltage Vb1, excluding the test results of specific individuals.

Figure 7:
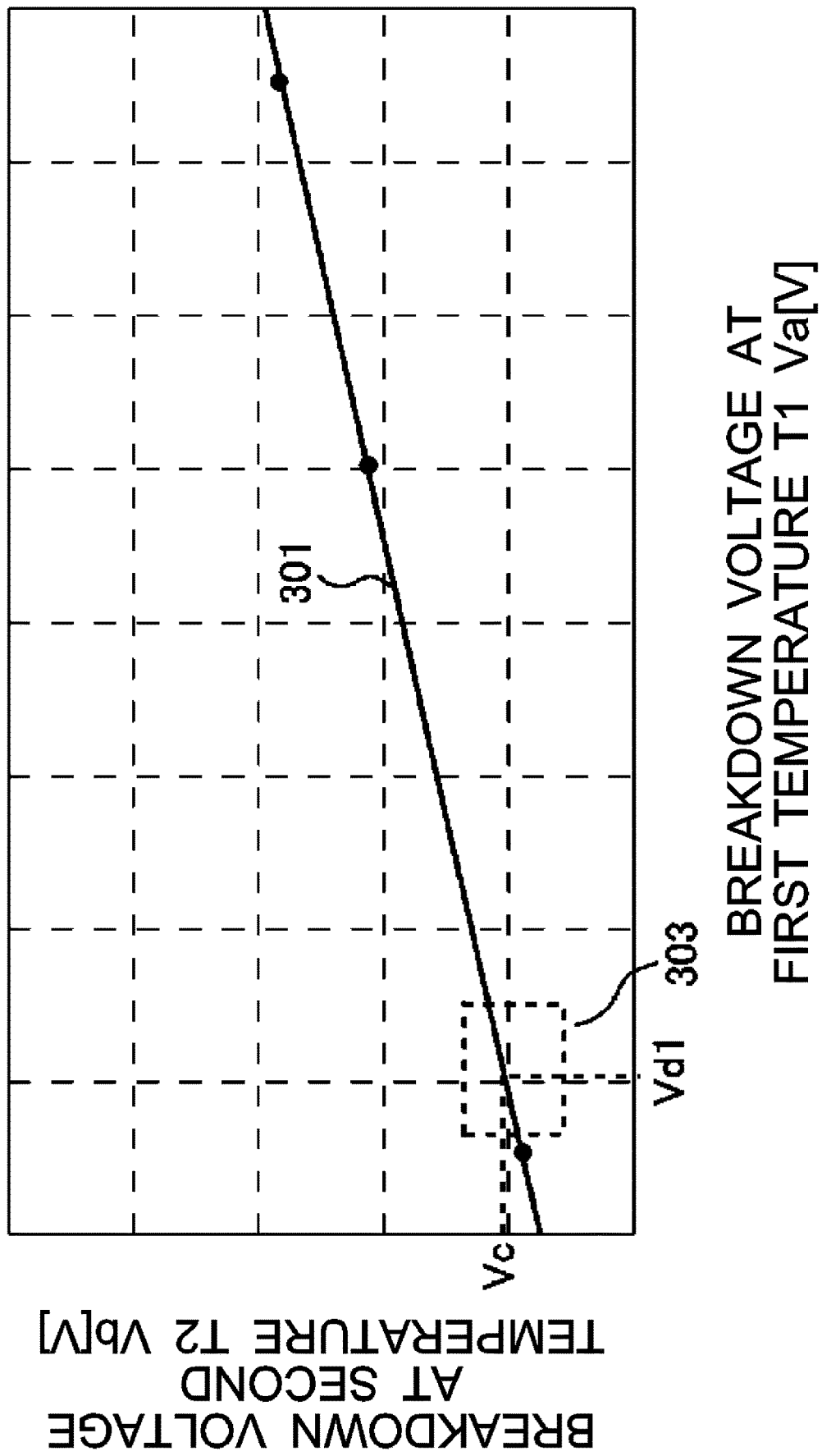
FIG. 7 shows another embodiment of the test method.

FIG. 7 shows another embodiment of the test method. In the test method of the present example, the first test step S104, the second test step S106, and the relationship acquisition step S108 are carried out for a first group including two or more groups for setting 200, and a roughly estimated value Vd1 of the applied voltage used when testing the semiconductor device under test at the first temperature T1 is acquired. That is, the similar contents to those described with reference to FIGS. 1 to 6 are performed to acquire the roughly estimated value Vd1 of the applied voltage at the time when testing the semiconductor device under test at the first temperature T1. In the present example, an approximate line 301 for the first group is acquired in a similar manner to the example shown in FIG. 6. FIG. 7 shows the relationship between the inspection voltage Va and the breakdown voltage Vb acquired using the first group, and the approximate line 301.

Next, the first test step S104, the second test step S106, and the relationship acquisition step S108 are carried out for a second group including two or more groups for setting 200 different from the first group. In the first test step S104 for the second group, the inspection voltage Va corresponding to the above-described roughly estimated value Vd1 of the applied voltage is assigned to each group for setting 200. For example, the inspection voltage Va within a predetermined voltage range 303 including the roughly estimated value Vd1 is assigned to each group for setting 200. That is, the inspection voltage Va near the roughly estimated value Vd1 is assigned to each group for setting 200.

Figure 8:
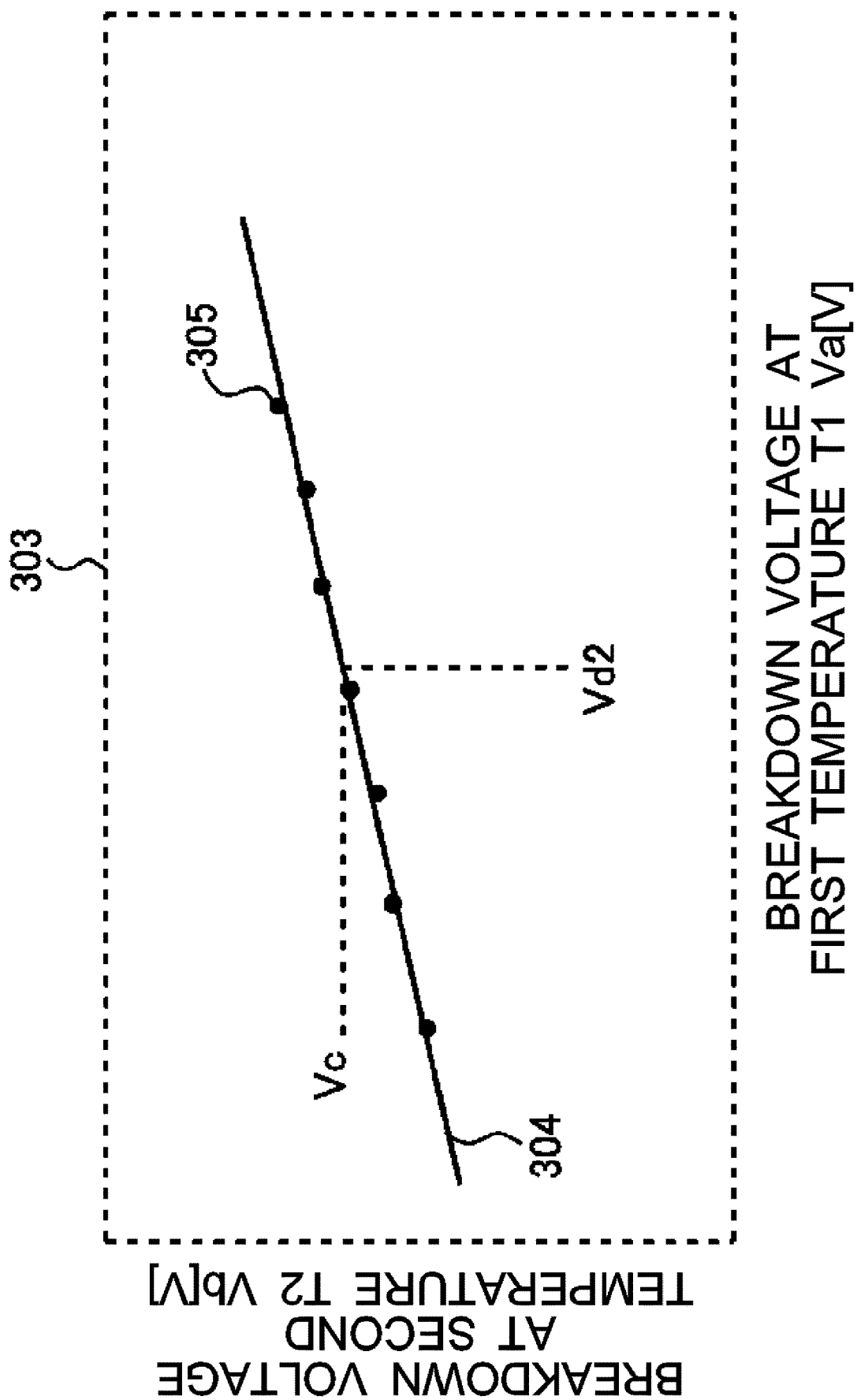
FIG. 8 shows processing for a second group.

FIG. 8 shows processing for the second group. As described above, the inspection voltage Va in the voltage range 303 near the roughly estimated value Vd1 is set for the groups for setting 200 of the second group. Then, the first test step S104 and the second test step S106 are performed to acquire the relationship between the inspection voltage and the breakdown voltage. In FIG. 8, each relationship is shown by a plot 305.

Then, in the relationship acquisition step S108, an approximate line 304 of the plurality of plots 305 is acquired. Further, based on the approximate line 304 and the predetermined withstand voltage Vc, an applied voltage Vd2 that is to be applied to the semiconductor device under test at the first temperature T1 is acquired.

By determining the applied voltage Vd2 in two steps in this way, many plots 305 can be arranged near the roughly estimated value Vd1, so that the applied voltage Vd2 can be set accurately. The number of the groups for setting 200 included in the second group may be larger than the number of the groups for setting 200 included in the first group. In addition, the number of the semiconductor devices for setting included in one group for setting 200 of the second group may be larger than the number of the semiconductor devices for setting included in one group for setting 200 of the first group. Thereby, the applied voltage Vd2 can be set more accurately.

Figure 9:
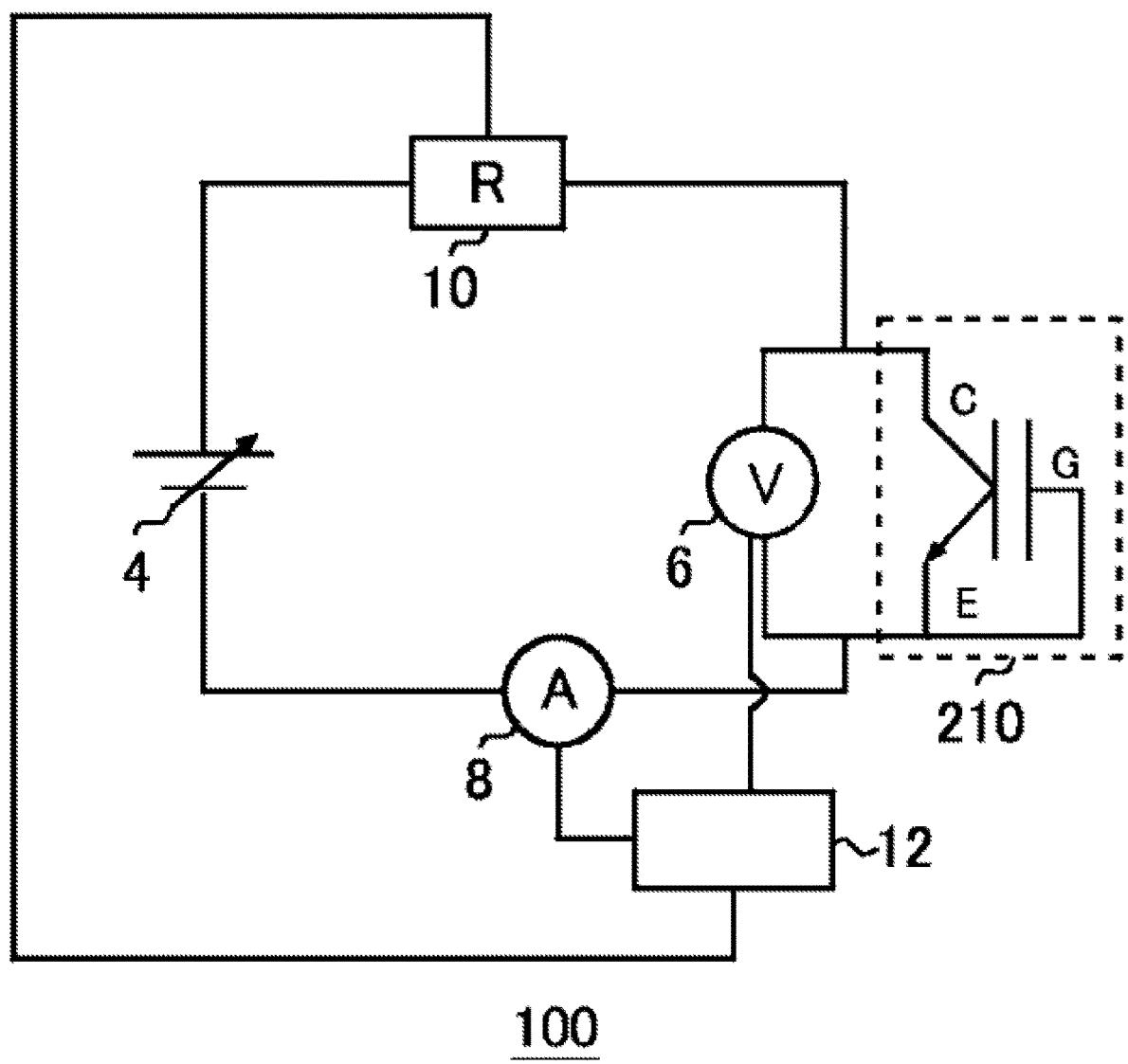
FIG. 9 shows an outline of a test device 100 for testing a semiconductor device for setting 210.

FIG. 9 shows an outline of a test device 100 for testing a semiconductor device for setting 210. The test device 100 may be used in the first test step S104 and the second test step S106. In addition, the test device 100 may also be used for a test of a semiconductor device under test. In the present example, the semiconductor device for setting 210 is an IGBT. The semiconductor device for setting 210 has a gate terminal G, a collector terminal C, and an emitter terminal E.

The test device 100 of the present example may be configured to further measure a leakage current (ICES) of the semiconductor device for setting 210 in at least any of the first test step S104 and the second test step S106. That is, the test device 100 may be configured to perform a breakdown test of the semiconductor device for setting 210 while measuring the leakage current.

The test device 100 of the present example includes a power supply 4, a voltmeter 6, an ammeter 8, a resistor 10, and a data processing unit 12. The collector terminal C of the semiconductor device for setting 210 is connected to the voltmeter 6 and the resistor 10. The gate terminal G and the emitter terminal E of the semiconductor device for setting 210 are connected to the ammeter 8. The test device 100 is configured to measure the leakage current (ICES) that flows between the collector terminal C and the emitter terminal E when a predetermined voltage $V_{CE}$ is applied between the collector terminal C and the emitter terminal of the semiconductor device 210 in a state where the gate terminal G and the emitter terminal E of the semiconductor device for setting 210 are short-circuited.

The power supply 4 is configured to apply a voltage to the semiconductor device for setting 210. In the present example, the power supply 4 is a voltage variable power supply capable of changing a voltage (applied voltage) that is applied to the semiconductor device for setting 210. As used herein, the applied voltage may refer to a voltage between the collector terminal C and the emitter terminal E of the semiconductor device. Further, applying a voltage to a semiconductor device means applying a voltage between the collector terminal C and the emitter terminal E of the semiconductor device, unless otherwise specified. When the power supply 4 applies a voltage to the semiconductor device for setting 210, a collector current flows through the collector terminal C of the semiconductor device for setting 210.

The voltmeter 6 is configured to measure the applied voltage applied to the semiconductor device for setting 210. The voltmeter 6 of the present example is configured to measure a voltage between the gate terminal G and the collector terminal C of the semiconductor device for setting 210 (or between the emitter terminal E and the collector terminal C of the semiconductor device for setting 210). The voltmeter 6 is connected to the gate terminal G, the collector terminal C, and the emitter terminal E of the semiconductor device for setting 210.

The ammeter 8 is configured to measure the collector current flowing through the collector terminal C of the semiconductor device for setting 210. The ammeter 8 of the present example is provided between the power supply 4 and the gate terminal G and emitter terminal E of the semiconductor device for setting 210.

The resistor 10 is configured to limit a current flowing through the semiconductor device for setting 210. The resistor 10 of the present example is provided between the power supply 4 and the collector terminal C of the semiconductor device for setting 210. In addition, the resistor 10 is connected to the data processing unit 12 and is configured to change a resistance value, based on an output of the data processing unit 12. That is, the data processing unit 12 is configured to control the resistance value of the resistor 10.

The data processing unit 12 is connected to the voltmeter 6 and the ammeter 8 and is configured to record a relationship between the applied voltage and the collector current of the semiconductor device for setting 210. The data processing unit 12 may be configured to calculate a leakage current of the semiconductor device for setting 210, based on a magnitude of the collector current at a time when a predetermined applied voltage is applied to the semiconductor device for setting 210. The data processing unit 12 may be configured to determine a quality of the semiconductor device for setting 210, based on the leakage current of the semiconductor device for setting 210.

The data processing unit 12 may be configured to adjust a waveform slope of a rising of the applied voltage at a time of applying the applied voltage to the semiconductor device for setting 210. The waveform slope of the applied voltage can be adjusted, for example, by a resistance value of the resistor 10 or a change rate of an output voltage of the power supply 4. The waveform slope of the rising of the applied voltage is a magnitude of a voltage that increases per unit time. During an ICES test for measuring a leakage current, the current or electric field may be concentrated on a specific place of the semiconductor device for setting 210, and the semiconductor device for setting 210 may be broken. It has been experimentally confirmed that a ratio (referred to as a breakdown ratio) of a number of breakdowns to a number of inspections of the semiconductor devices changes depending on the waveform slope of the rising of the applied voltage. The data processing unit 12 may be configured to adjust the breakdown ratio of the semiconductor device for setting 210 at a time of leakage current test by adjusting the waveform slope of the rising of the applied voltage. For example, when the breakdown ratio of the semiconductor device for setting 210 at the time of the leakage current test is increased, the semiconductor device for setting 210 that is relatively susceptible to breakdown can be removed in advance, so that the breakdown of the semiconductor device for setting 210 after being distributed in the market can be reduced.

Figure 10:
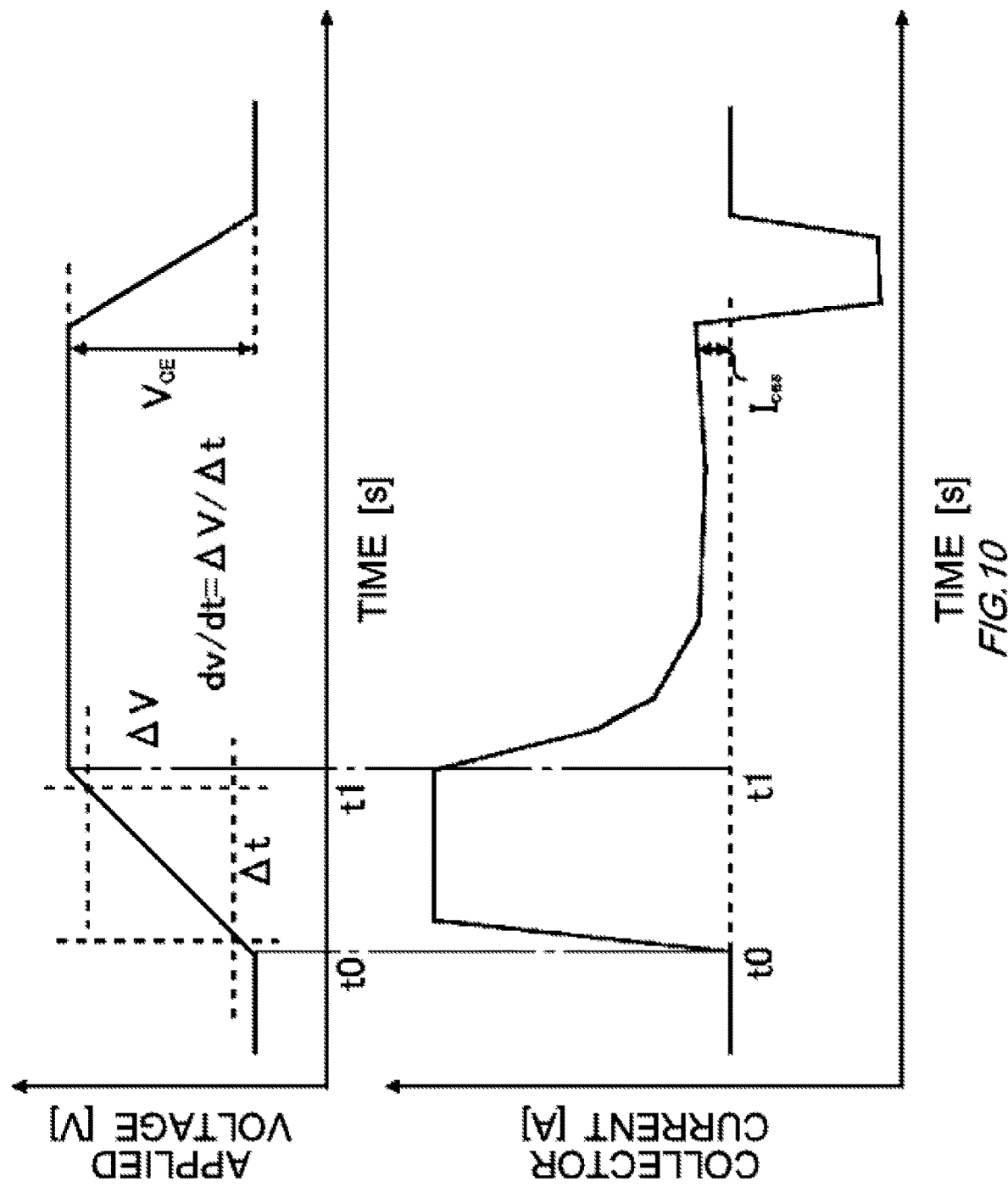
FIG. 10 shows a measurement example of a leakage current.

FIG. 10 shows a measurement example of a leakage current. FIG. 10 shows changes of the applied voltage and the leakage current (collector current) over time, respectively. In the graphs of the applied voltage and the collector current, a time at which the voltage application is started is denoted as t0.

In the leakage current measurement, the voltage of the power supply 4 is set to a specified voltage $V_{CE}$. For example, in the first test step S104, the inspection voltage Va assigned as the specified voltage $V_{CE}$ is used. In the second test step S106, as shown in S504 of FIG. 5, the specified voltage $V_{CE}$ is gradually increased to detect, as the breakdown voltage Vb, the specified voltage $V_{CE}$ in a step in which the semiconductor device for setting 210 is broken or the specified voltage $V_{CE}$ in a previous step.

The applied voltage that is applied to the semiconductor device for setting 210 increases with a predetermined waveform slope from 0 V until it reaches the specified voltage $V_{CE}$. In FIG. 10, a time at which the applied voltage reaches the specified voltage $V_{CE}$ is denoted as t1. Even after time t1 has elapsed, when the power supply 4 is kept at the specified voltage $V_{CE}$, a displacement current of the test device 100 to a parasitic capacitance decreases and the current value of the collector current becomes stable. At this timing, the collector current is measured as a leakage current. The leakage current is denoted as $I_{CES}$ in FIG. 10.

The waveform slope (dv/dt) of the rising of the applied voltage is expressed by the following formula.

$$dV/dt = \Delta V/\Delta t$$

$\Delta V$ and $\Delta t$ are amounts of change in the applied voltage (V) and time (t) shown in FIG. 10. $\Delta t$ may be the entire period from time t0 to time t1 shown in FIG. 10, or may also be a part thereof. $\Delta t$ may be a period during which the waveform slope of the rising of the applied voltage is substantially uniform. The waveform slope of the rising of the applied voltage may not be uniform near time t0 and near time t1. Therefore, $\Delta t$ may be a period that does not include time t0 and time t1. $\Delta t$ may be a period including a central time between time t0 and time t1.

Figure 11:
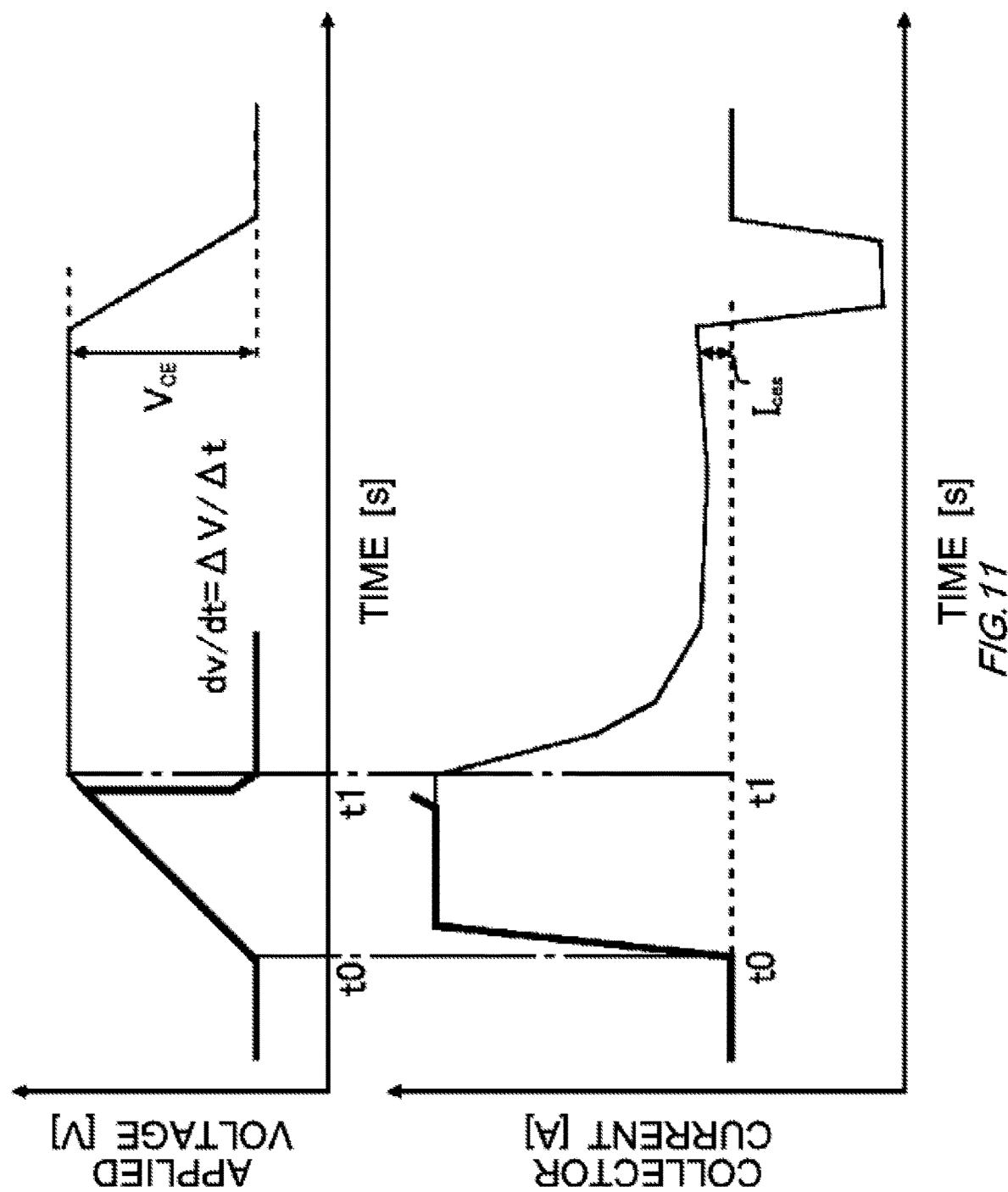
FIG. 11 shows a case where the semiconductor device for setting 210 is broken during leakage current measurement.

FIG. 11 shows a case where the semiconductor device for setting 210 is broken during leakage current measurement. A thick line in FIG. 11 indicates a waveform when the semiconductor device for setting 210 is broken. When the applied voltage is increased, the semiconductor device for setting 210 may undergo dielectric breakdown between the collector and the emitter. Thereby, a voltage approaches 0 V, and a large collector current flows between the collector and the emitter. In the first test step S104 and the second test step S106, the broken semiconductor device for setting 210 is screened. In addition, the same applies to a test of a semiconductor device under test.

It has been experimentally confirmed that, even when the specified voltage $V_{CE}$ is the same, the semiconductor device for setting 210 is changed as to whether it is broken or not, due to the waveform slope of the rising of the applied voltage. For this reason, if a test of leakage current is performed without adjusting the waveform slope of the rising of the applied voltage, the semiconductor device for setting 210 having a breakdown resistance level, which should not be originally distributed in the market, may be broken after being distributed in the market without being broken during leakage current inspection. In a test of a semiconductor device under test, the waveform slope of the rising of the applied voltage is preferably set to a value at which the semiconductor device under test is susceptible to breakdown. In addition, in order to match test conditions of the semiconductor device under test and the semiconductor device for setting 210, the waveform slope of the rising of the applied voltage is preferably set to a value at which the semiconductor device for setting 210 is susceptible to breakdown, also in the first test step S104 and the second test step S106. That is, in the test of the semiconductor device under test and the test of the semiconductor device for setting 210, the set values of the waveform slope dv/dt of the rising of the applied voltage are preferably the same.

Figure 12:
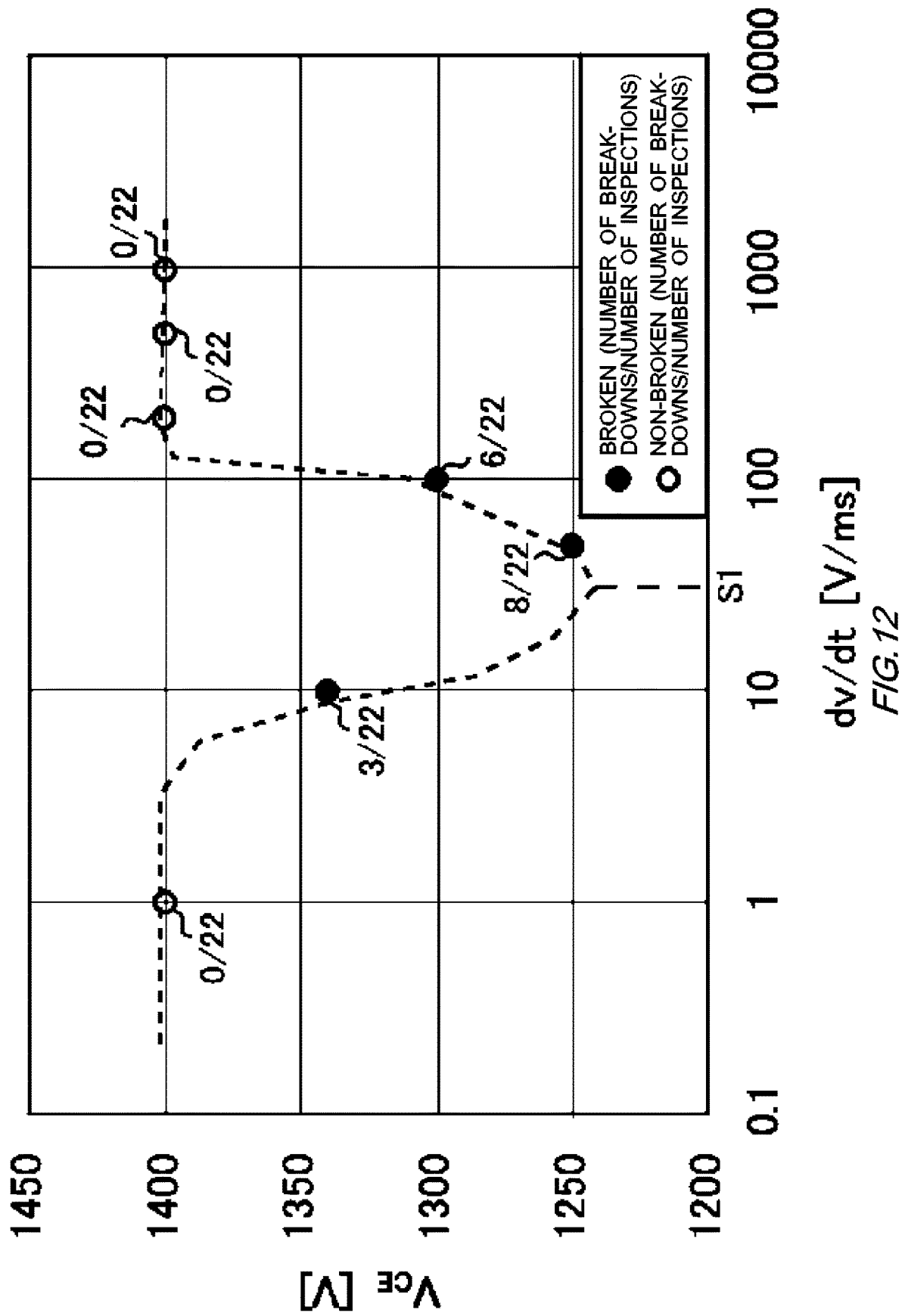
FIG. 12 shows a relationship between a slope (dv/dt) of a rising of an applied voltage and a breakdown ratio of a semiconductor device.

FIG. 12 shows a relationship between a waveform slope (dv/dt) of a rising of an applied voltage and a breakdown ratio of a semiconductor device. The horizontal axis in FIG. 12 indicates the waveform slope (dv/dt) of the rising of the applied voltage, and the vertical axis indicates the applied voltage $V_{CE}$. In addition, at each plot in FIG. 12, the number of inspected semiconductor devices (denominator) and the number of broken semiconductor devices (numerator) are shown. In FIG. 12, while increasing the applied voltage to the semiconductor device to 1400V at each waveform slope (dv/dt), the applied voltage at which the semiconductor device was first broken is plotted. That is, the vertical axis in FIG. 12 corresponds to the withstand voltage of the semiconductor device.

In FIG. 12, black circles indicate that there was breakdown, and white circles indicate that there was no breakdown. The breakdown ratio is attached to each of the black and white circles. In terms of the breakdown ratio, the numerator and denominator refer to the number of breakdowns and the number of inspections. For example, 0/22 indicates that the number of breakdowns was 0 (that is, there was no breakdown) with respect to the number of inspections 22. 8/22 indicates that the number of breakdowns was 8 (that is, there were breakdowns) with respect to the number of inspections 22.

In ranges where the waveform slope dv/dt of the applied voltage is 1 or less and exceeds 100, even when the applied voltage $V_{CE}$ reaches the upper limit value of 1400 V, the number of broken semiconductor devices is 0. On the other hand, in a region where the waveform slope dv/dt is 10 to 100 [V/ms], the semiconductor device is broken in a step where the applied voltage $V_{CE}$ is lower than 1400V. As shown in FIG. 12, when the waveform slope dv/dt becomes a specific value S1, the withstand voltage of the semiconductor device becomes a relative minimum value and the breakdown ratio of the semiconductor device shows a relative maximum value.

Figure 13:
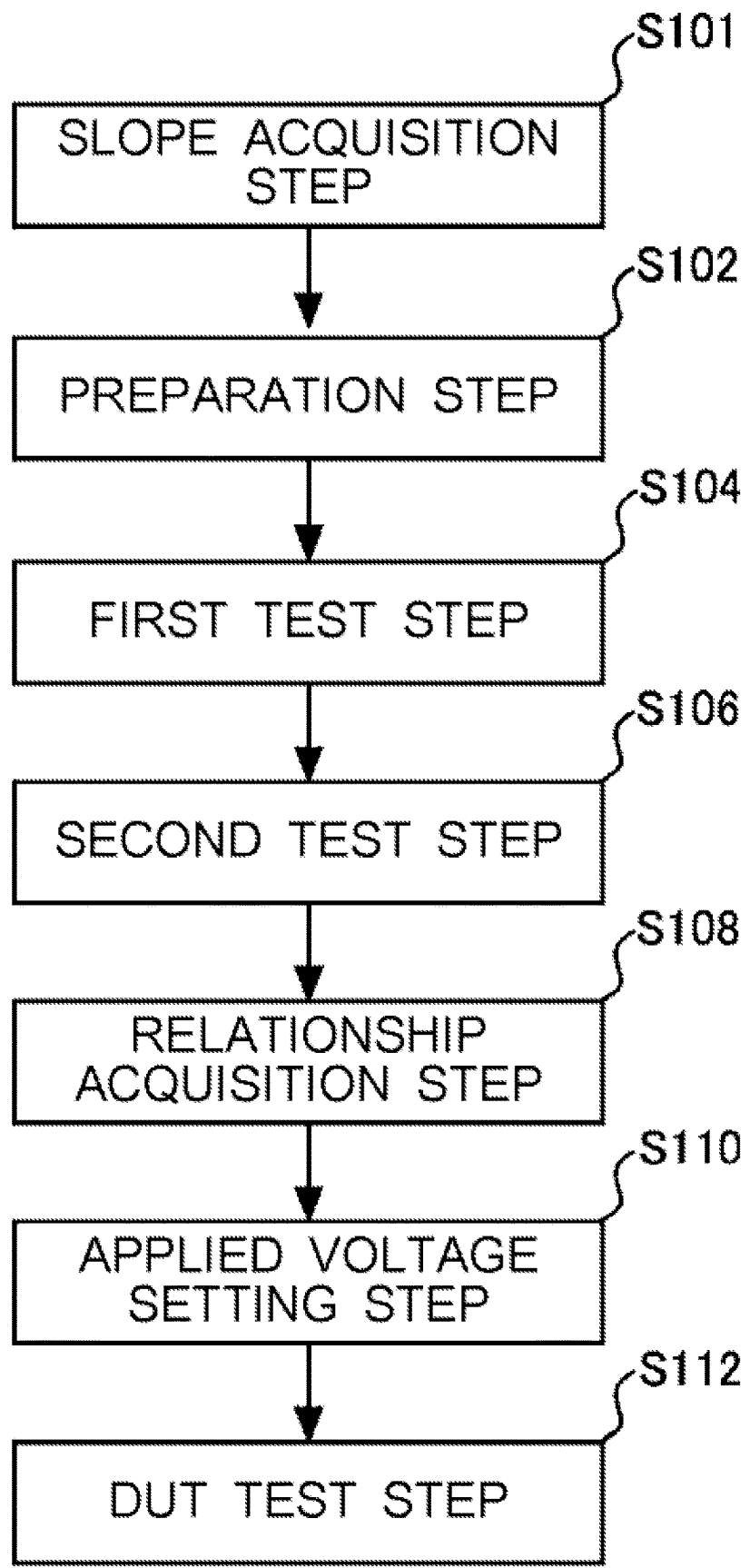
FIG. 13 is a flowchart showing another example of the test method.

FIG. 13 is a flowchart showing another example of the test method. The test method the present example further has a slope acquisition step S101, with respect to the test method described with reference to FIGS. 1 to 12. The other processes are similar to the test method described with reference to FIGS. 1 to 12.

In the slope acquisition step S101, the specific value S1 of the waveform slope dv/dt described with reference to FIG. 12 is acquired. The specific value S1 is a waveform slope at which a voltage at which the semiconductor device for setting 210 is broken is the lowest. The specific value S1 is not strictly required to be the same as a waveform slope at which the withstand voltage of the semiconductor device becomes a relative minimum value or the breakdown ratio of the semiconductor device becomes a relative maximum value. The specific value S1 may have an error of 10% or less with respect to the waveform slope at which the withstand voltage of the semiconductor device becomes a relative minimum value or the breakdown ratio of the semiconductor device becomes a relative maximum value.

In the slope acquisition step S101, the specific value S1 may be acquired by testing a plurality of semiconductor devices, as described with reference to FIG. 12. In this case, the semiconductor device used to acquire the specific value S1 is an individual different from the semiconductor device for setting 210. The semiconductor device is preferably manufactured with the same design as the semiconductor device for setting 210. Further, in the slope acquisition step S101, the specific value S1 set in advance for each type of the semiconductor device for setting 210 may be acquired.

In the first test step S104 and the second test step S106, the specific value S1 is used as the waveform slope dv/dt of the applied voltage to the semiconductor device for setting 210. Further, also in the DUT test step S112, the specific value S1 is used as the waveform slope dv/dt of the applied voltage to the semiconductor device under test. This makes it possible to screen the semiconductor device under test that is susceptible to breakdown. Further, the conditions of the first test step S104 and the second test step S106 can be matched with the conditions of the DUT test step S112.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

4: power supply, 6: voltmeter, 8: ammeter, 10: resistor, 12: data processing unit, 100: test device, 200: group for setting, 210: semiconductor device for setting, 220: non-defective group, 230: defective group, 300: approximate line, 301: approximate line, 303: voltage range, 304: approximate line, 305: plot

What is claimed is:

1. A test method of a semiconductor device, the test method comprising:
   preparing a plurality of groups for setting, each of which has a plurality of semiconductor devices for setting, and assigning an inspection voltage to each of the plurality of groups for setting, wherein the inspection voltages assigned to the plurality of groups are different from each other;
   performing first testing by applying the assigned inspection voltage to the plurality of semiconductor devices for setting included in each of the plurality of groups for setting, and testing, at a first temperature, the plurality of semiconductor devices for setting included in each of the plurality of groups for setting;
   performing second testing by testing, at a second temperature different from the first temperature, a selected one of the plurality of the semiconductor devices for setting having been determined as being non-defective in the performing the first testing and by detecting a breakdown voltage at which the selected one of the plurality of semiconductor devices for setting is broken;
   acquiring a relationship between the inspection voltage and the breakdown voltage in each of the plurality of groups for setting; and
   setting an applied voltage used when testing a semiconductor device under test at the first temperature, based on the relationship acquired in the acquiring the relationship, the semiconductor device under test separate from ones of the plurality of semiconductor devices for setting.

2. The test method according to claim 1, wherein the second temperature is lower than the first temperature.

3. The test method according to claim 2, wherein in the setting the applied voltage, the applied voltage is set based on a relationship between a withstand voltage that the semiconductor device under test should have at the second temperature and the relationship between the inspection voltage and the breakdown voltage.

4. The test method according to claim 2, wherein in the performing the second testing, the lowest breakdown voltage in each of the plurality of groups for setting is detected.

5. The test method according to claim 2, wherein in the performing the second testing, a distribution of the breakdown voltages in each of the plurality of groups for setting is detected.

6. The test method according to claim 2, further comprising acquiring a slope by acquiring a waveform slope of the inspection voltage to be applied to the semiconductor device for setting, the waveform slope enabling a voltage at which the semiconductor device for setting is broken to be the lowest, wherein
   in the performing the first testing and in the performing the second testing, the semiconductor device for setting is tested using the waveform slope acquired in the acquiring the slope.

7. The test method according to claim 2, wherein the performing the first testing, the performing the second testing and the acquiring the relationship are carried out for a first group including two or more the plurality of groups for setting, to acquire a roughly estimated value of the applied voltage used when testing the semiconductor device under test at the first temperature,
   the performing the first testing, the performing the second testing and the acquiring the relationship are carried out by assigning the inspection voltage corresponding to the roughly estimated value of the applied voltage to a second group including two or more of the plurality of groups for setting different from the first group, and
   the applied voltage to the semiconductor device under test is set based on the relationship acquired in the acquiring the relationship for the second group, in the setting the applied voltage.

8. The test method according to claim 1, wherein in the setting the applied voltage, the applied voltage is set based on a relationship between a withstand voltage that the semiconductor device under test should have at the second temperature and the relationship between the inspection voltage and the breakdown voltage.

9. The test method according to claim 8, wherein
in the performing the second testing, the lowest breakdown voltage in each of the plurality of groups for setting is detected.

10. The test method according to claim 8, wherein
in the performing the second testing, a distribution of the breakdown voltages in each of the plurality of groups for setting is detected.

11. The test method according to claim 8, further comprising acquiring a slope by acquiring a waveform slope of the inspection voltage to be applied to the semiconductor device for setting, the waveform slope enabling a voltage at which the semiconductor device for setting is broken to be the lowest, wherein
in the performing the first testing and in the performing the second testing, the semiconductor device for setting is tested using the waveform slope acquired in the acquiring the slope.

12. The test method according to claim 8, wherein
the performing the first testing, the performing the second testing and the acquiring the relationship are carried out for a first group including two or more of the plurality of groups for setting, to acquire a roughly estimated value of the applied voltage used when testing the semiconductor device under test at the first temperature,
the performing the first testing, the performing the second testing and the acquiring the relationship are carried out by assigning the inspection voltage corresponding to the roughly estimated value of the applied voltage to a second group including two or more of the plurality of groups for setting different from the first group, and
the applied voltage to the semiconductor device under test is set based on the relationship acquired in the acquiring the relationship for the second group, in the setting the applied voltage.

13. The test method according to claim 1, wherein
in the performing the second testing, the lowest breakdown voltage in each of the plurality of groups for setting is detected.

14. The test method according to claim 13, wherein
in the performing the second testing, one or more of the semiconductor devices for setting are sequentially tested, and in each testing of the semiconductor devices for setting, the inspection voltage that is applied to the semiconductor device for setting is gradually increased to detect the breakdown voltage of the semiconductor device for setting, and if the inspection voltage that is applied to each of the semiconductor devices for setting has reached the breakdown voltage of the semiconductor device for setting tested already, next one of the semiconductor devices for setting is tested.

15. The test method according to claim 14, further comprising acquiring a slope by acquiring a waveform slope of the inspection voltage to be applied to the semiconductor device for setting, the waveform slope enabling a voltage at which the semiconductor device for setting is broken to be the lowest, wherein
in the performing the first testing and in the performing the second testing, the semiconductor device for setting is tested using the waveform slope acquired in the acquiring the slope.

16. The test method according to claim 13, further comprising acquiring a slope by acquiring a waveform slope of the inspection voltage to be applied to the semiconductor device for setting, the waveform slope enabling a voltage at which the semiconductor device for setting is broken to be the lowest, wherein
in the performing the first testing and in the performing the second testing, the semiconductor device for setting is tested using the waveform slope acquired in the acquiring the slope.

17. The test method according to claim 13, wherein
the performing the first testing, the performing the second testing and the acquiring the relationship are carried out for a first group including two or more of the plurality of groups for setting, to acquire a roughly estimated value of the applied voltage used when testing the semiconductor device under test at the first temperature,
the performing the first testing, the performing the second testing and the acquiring the relationship are carried out by assigning the inspection voltage corresponding to the roughly estimated value of the applied voltage to a second group including two or more of the plurality of groups for setting different from the first group, and
the applied voltage to the semiconductor device under test is set based on the relationship acquired in the acquiring the relationship for the second group, in the setting the applied voltage.

18. The test method according to claim 1, wherein
in the performing the second testing, a distribution of the breakdown voltages in each of the plurality of groups for setting is detected.

19. The test method according to claim 1, further comprising acquiring a slope by acquiring a waveform slope of the inspection voltage to be applied to the semiconductor device for setting, the waveform slope enabling a voltage at which the semiconductor device for setting is broken to be the lowest, wherein
in the performing the first testing and in the performing the second testing, the semiconductor device for setting is tested using the waveform slope acquired in the acquiring the slope.

20. The test method according to claim 1, wherein
the performing the first testing, the performing the second testing and the acquiring the relationship are carried out for a first group including two or more of the plurality of groups for setting, to acquire a roughly estimated value of the applied voltage used when testing the semiconductor device under test at the first temperature,
the performing the first testing, the performing the second testing and the acquiring the relationship are carried out by assigning the inspection voltage corresponding to the roughly estimated value of the applied voltage to a second group including two or more of the plurality of groups for setting different from the first group, and
the applied voltage to the semiconductor device under test is set based on the relationship acquired in the acquiring the relationship for the second group, in the setting the applied voltage.

* * * * *